United States Patent
Wang et al.

(10) Patent No.: US 10,418,957 B1
(45) Date of Patent: Sep. 17, 2019

(54) AUDIO EVENT DETECTION

(71) Applicant: Amazon Technologies, Inc., Seattle, WA (US)

(72) Inventors: Weiran Wang, Arlington, MA (US); Chao Wang, Newton, MA (US); Chieh-Chi Kao, Cambridge, MA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/023,990

(22) Filed: Jun. 29, 2018

(51) Int. Cl.
*H03G 3/32* (2006.01)
*G10L 25/78* (2013.01)
*G06N 5/04* (2006.01)

(52) U.S. Cl.
CPC .............. *H03G 3/32* (2013.01); *G06N 5/042* (2013.01); *G06N 5/046* (2013.01); *G10L 25/78* (2013.01)

(58) Field of Classification Search
CPC ................. H04R 2410/07; H04R 2430/03; H04R 27/00; H04R 3/04; H04R 3/12; H04R 29/00; H04R 29/001; H04S 2420/07; H04S 3/00; H04S 3/008; H04S 7/305; H04S 7/30; H04B 14/04; H04B 14/06; H04B 1/667; G10L 19/0208; G10L 21/04; G10L 21/043; G10L 19/02; G10L 19/00; G10L 19/008; G10L 25/48; G10L 25/51; G10L 15/18; G10L 15/20; G10L 19/005; G10L 19/0204; G10L 19/022; G10L 2015/223; G10L 19/0212; G10L 19/26; G10L 21/038; G10L 21/0388; G10L 25/12; G10L 19/173; G10L 21/0232; G10L 21/028; G10L 25/18; G10L 19/032; G10L 19/083

USPC ..... 381/56–58, 17–23, 97; 700/94; 704/500, 704/205
See application file for complete search history.

(56) References Cited

U.S. PATENT DOCUMENTS

| 8,438,036 | B2 * | 5/2013 | Yu ...................... H03H 17/0628 704/200 |
| 9,554,208 | B1 * | 1/2017 | Jain ......................... H04R 3/005 |
| 2007/0100606 | A1 * | 5/2007 | Rogers ..................... G10L 19/26 704/205 |
| 2009/0024395 | A1 * | 1/2009 | Banba ................. G10L 19/0204 704/500 |

(Continued)

OTHER PUBLICATIONS

D. Bandanau, et al., "End-To-End Attention-Based Large Vocabulary Speech Recognition," Aug. 18, 2015, arXiv:1508.04395.

(Continued)

*Primary Examiner* — Lun-See Lao
(74) *Attorney, Agent, or Firm* — Pierce Atwood LLP

(57) ABSTRACT

An audio event detection system that subsamples input audio data using a series of recurrent neural networks to create data of a coarser time scale than the audio data. Data frames corresponding to the coarser time scale may then be upsampled to data frames that match the finer time scale of the original audio data frames. The resulting data frames are then scored with a classifier to determine a likelihood that the individual frames correspond to an audio event. Each frame is then weighted by its score and a composite weighted frame is created by summing the weighted frames and dividing by the cumulative score. The composite weighted frame is then scored by the classifier. The resulting score is taken as an overall score indicating a likelihood that the input audio data includes an audio event.

17 Claims, 16 Drawing Sheets

(56) References Cited

U.S. PATENT DOCUMENTS

| | | | | |
|---|---|---|---|---|
| 2012/0084089 A1* | 4/2012 | Lloyd | ............... | G10L 15/20 704/500 |
| 2014/0161279 A1* | 6/2014 | Jones | ............... | H04R 3/12 381/97 |
| 2017/0303032 A1* | 10/2017 | Hester | ............... | H04R 1/22 |
| 2018/0293994 A1* | 10/2018 | Niedermeier | ............... | G10L 19/02 |

OTHER PUBLICATIONS

D. Miao, et al., "Simplifying Long Short-Term Memory Acoustic Models for Fast Training and Decoding," in Proc. of the IEEE Int. Conf. Acoustics, Speech and Sig. Proc. (ICASSP'16) Shanghai, China, Mar. 20-25, 2016.

A. Mesaros, et al., "Tut Database for Acoustic Scene Classification and Sound Event Detection," in 2016, pp. 1128-1132.

D. Kingma, et al., "Adam: A Method for Stochastic Optimization," in Proc. Of the 3rd Int. Conf. Learning Representations (ICLR2015), San Diego, CA, May 7-9, 2015.

K. Cho, et al., "Learning Phrase Representations Using RNN Encoder-Decoder for Statistical Machine Translation," in Proc. 2014 Conference on Empirical Methods in Natural Language Processing, Doha, Qatar, Oct. 25-29, 2014.

S. Ren, et al., "Faster r-cnn: Towards Real-Time Object Detection with Region Proposal Networks," in Advances in Neural Information Processing Systems (NIPS), 2015, pp. 91-99.

A. Mesaros, et al., "DCASE 2017 Challenge Setup: Tasks, Datasets and Baseline System," in Proceedings of the Detection and Classification of Acoustic Scenes and Events 2017 Workshop, (DCASE2017), Nov. 2017, pp. 85-92.

K. Wang, et al., "Audio Events Detection and Classification Using Extended R.-FCN Approach." DCASE2017 Challenge, Tech. Rep., Sep. 2017.

R. Dobre, et al., "Low Computational Method for Siren Detection," in 2015 IEEE21st International Symposium for Design and Technology in Electronic Packaging (SIITME), Oct. 2015, pp. 291-295.

P. Foggia, et al., "Audio Surveillance of Roads: A System for Detecting Anomalous Sounds," IEEE Transactions on Intelligent Transportation Systems, vol. 17, No. 1, pp. 279-288, Jan. 2016.

J. Rouas, et al., "Audio Events Detection in Public Transport Vehicle," in 2006 IEEE Intelligent Transportation Systems Conference, Sep. 2006, pp. 733-738.

P. Laffitte, et al., "Deep Neural Networks for Automatic Detection of Screams and Shouted Speech in Subway Trains," in 2016 IEEE International Conference on Acoustics, Speech and Signal Processing (ICASSP), Mar. 2016, pp. 6460-6464.

D. Stowell, et al., "Detection and Classification of Acoustic Scenes and Events," IEEE Transaction on Multimedia, vol. 17, No. 10, pp. 173-1746, Oct. 2015.

T. Virtanen, et al., Proceedings of the Detection and Classification of Acoustic Scenes and Events 2016 Workshop (DCASE2016). Tampere University of Technology. Department of Signal Processing, 2016.

H. Lim, et al. "Rare Sound Event Detection Using ID Convolution Recurrent Neural Networks," DCASE2017 Challenge, Tech. Rep, Sep. 2017.

E. Cakir, et al., "Convolutional Recurrent Neural Networks for Rare Sound Event Detection," DCASE2017 Challenge, Tech. Rep., Sep. 2017.

H. Phan, et al., "DNN and CNN with Weighted and Multi-task Loss Functions for Audio Event Detection," DCASE2017 Challenge, Tech. Rep., Sep. 2017.

K. He, et al., "Deep Residual Learning for Image Recognition" in 2016 IEEE Conference on Computer Vision and Pattern Recognition (CVPR), Jun. 2016 pp. 770-778.

R. Girshick, "Fast r-cnn," in 2015 IEEE International Conference on Computer Vision (ICCV), Dec. 2015.

A. Neubeck, et al., "Efficient non-maximum Suppression," in Proceedings of the 18th International Conference on Pattern Recognition—vol. 03, ser. ICPR '06. Washington, D.C., USA: IEEE Computer Society, 2006, pp. 850-855.

O. Russakovsky, et al., "ImageNet Large Scale Visual Recognition Challenge," International Journal of Computer Vision (IJCV), vol. 115, No. 3 pp. 211-252, 2015.

K. Simonyan, et al., "Very Deep Convolutional Networks for Large-Scale Image Recognition," CoRR, vol. abs/1409.1556, 2014. Online, Available: http://arvix.org/abs1409.1556.

A. Mesaros, et al. "Metrics for Polyphonic Sound Event Detection," Applied Sciences, vol. 6, No. 6, p. 162, 2016.

The Examiner's attention is hereby drawn to the specification and file history of co-pending U.S. Appl. No. 16/023,923, entitled "Audio Event Detection", filed Jun. 29, 2018, which may contain information relevant to the present application.

D. Bahdanau, K. Cho, and Y. Bengio, "Neural machine translation by jointly learning to align and translate," in Proc. of the 3rd Int. Conf. Learning Representations (ICLR 2015), San Diego, CA, May 7-9, 2015.

* cited by examiner

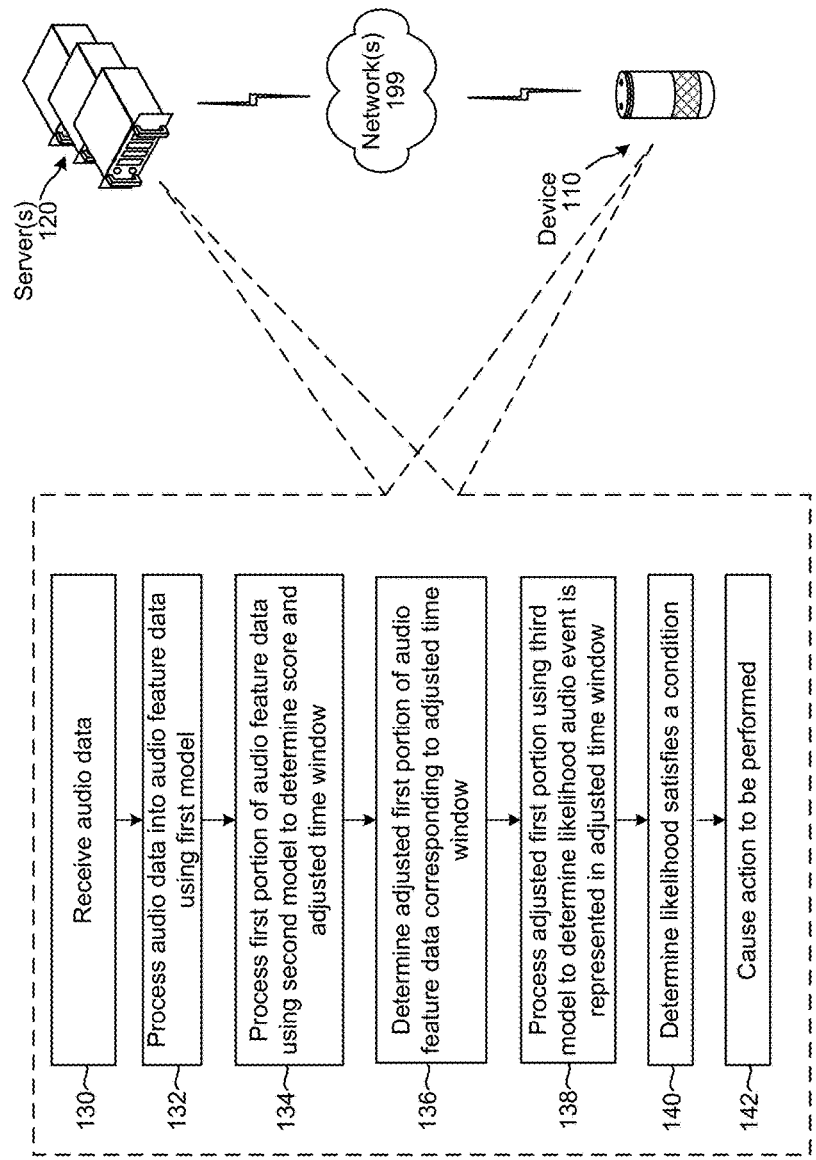

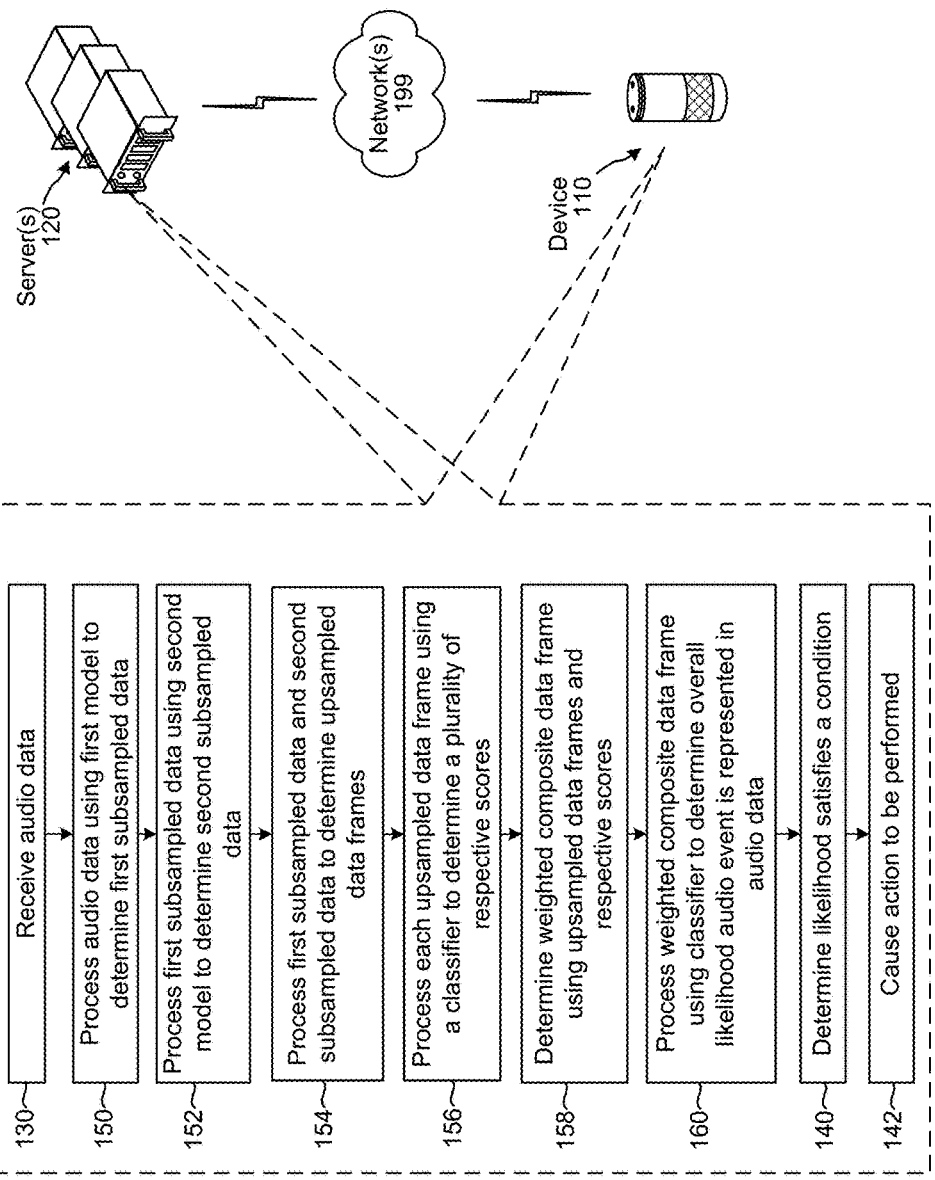

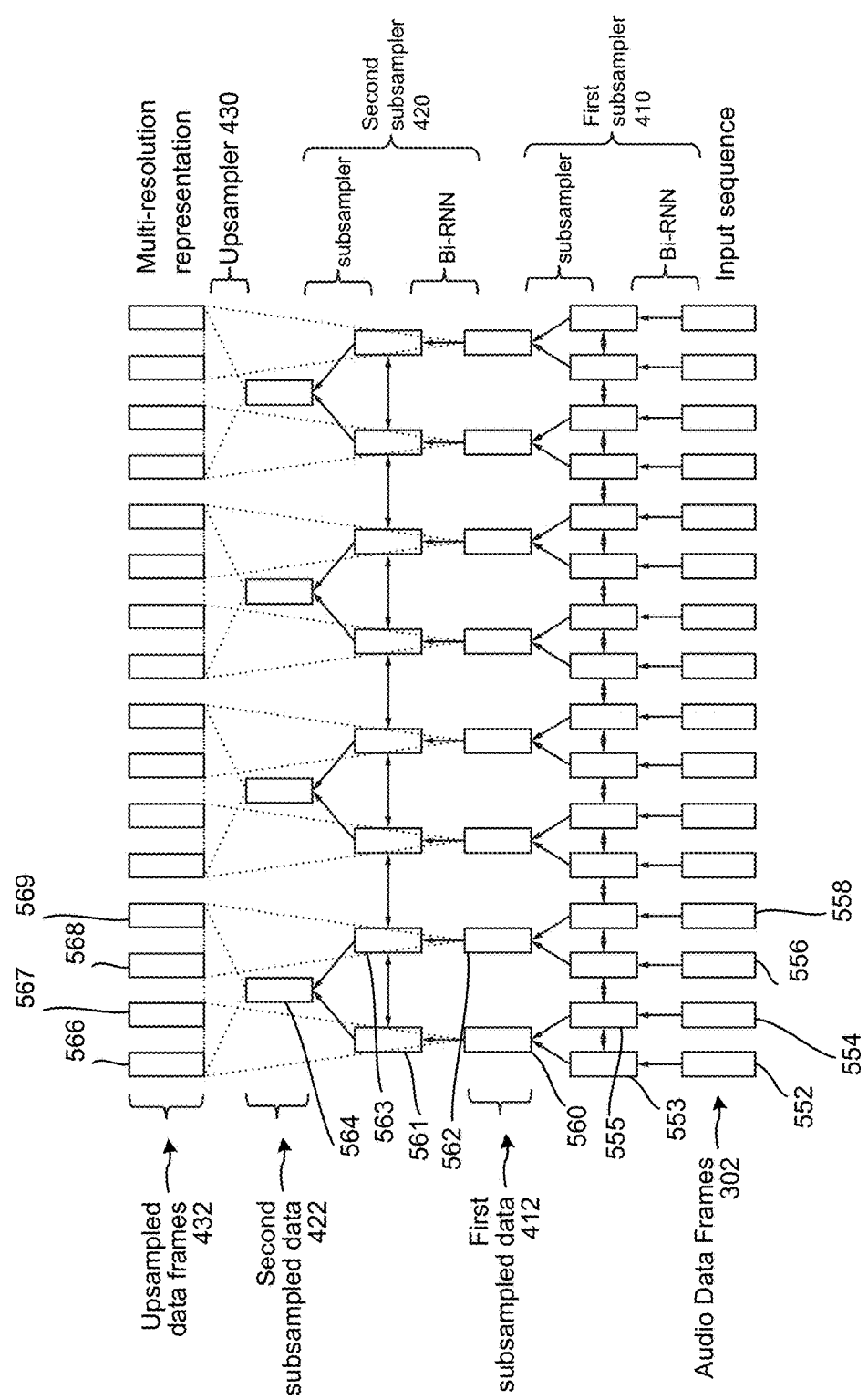

AUDIO EVENT DETECTION

BACKGROUND

Devices may be configured with microphones that can capture audio and convert the audio to audio data. Certain techniques may be employed by devices and systems to process the audio data to perform various operations.

BRIEF DESCRIPTION OF DRAWINGS

For a more complete understanding of the present disclosure, reference is now made to the following description taken in conjunction with the accompanying drawings.

FIG. 1A illustrates a system for detecting audio events according to embodiments of the present disclosure.

FIG. 1B illustrates a system for detecting audio events according to embodiments of the present disclosure.

FIGS. 5A and 5B are diagrams illustrating data processing for detecting audio events according to embodiments of the present disclosure.

DETAILED DESCRIPTION

Figure 2:
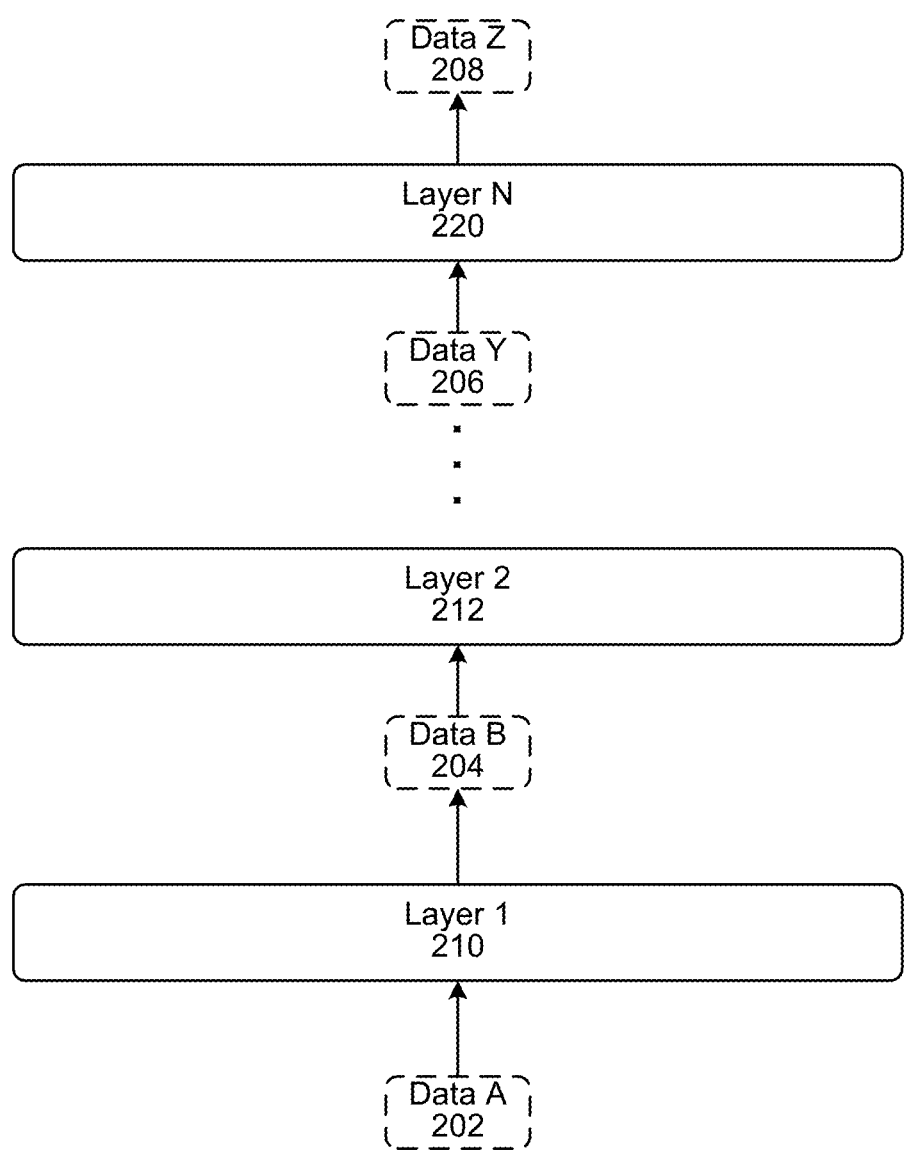
FIG. 2 is a conceptual diagram illustrating layers of a trained model according to embodiments of the present disclosure.

An audio event is an event that results in audio that may be distinctive to the type of particular event. There are many kinds of audio events such as a user speaking an utterance, a baby crying, a car honking, etc. The ability for a computing system to detect an audio event may have a variety of uses including security, home automation, parenting notifications, or the like. Audio event detection may be particularly useful when other indicators (such as visual data) may be unavailable. Audio event detection may be done by comparing input audio data to an audio signature corresponding to the audio event and if there is a sufficient match between the signature and the input audio data, the system may determine that an audio event has occurred and take action accordingly.

Audio event detection may, however, suffer from a number of challenges including the potential for false positives (e.g., a system detecting an event where there was none), missed positives (e.g., a system failing to detect an event where there was one), data variance leading to undesired results, and other issues. Further, typical audio event detection focuses only on whether an event was detected and does not necessarily provide further information, such as when a specific audio event began or ended, or other information.

Machine learning (ML) is a valuable computing technique that allows computing systems to learn techniques for solving complex problems without needing an explicit algorithm for the computing system to follow. ML may use a trained model that consists of internally configured operations that can manipulate a particular type of input data to determine a desired result. Trained models are used in many computing tasks such as computer vision, speech processing, predictive analyses, and may also be used in audio event detection.

Trained models come in a variety of forms including include trained classifiers, Support Vector Machines (SVMs), neural networks (such as deep neural networks (DNNs), recurrent neural networks (RNNs), or convolutional neural networks (CNNs)) and others. As an example, a neural network typically includes an input layer, an output layer and one or more intermediate hidden layers where the input layer is configured to take in a certain kind of data and the output layer is configured to output the desired kind of data to result from the network and the hidden layer(s) perform a variety of functions to go from the input data to the output data.

Various techniques may be used to train ML models including backpropagation, statistical learning, supervised learning, semi-supervised learning, stochastic learning, or other known techniques. In supervised learning a model may be configured to infer a function from labeled training data. Thus a computing system may use training data in the form of training examples that provide examples of the kinds of input data the model will be configured to process at runtime as well as an accompanying "ground truth" for each training example. The ground truth provides the correct response for the respective training example, thus providing a complete example that can be used to train the model. Other data that may be used to train a model may include training parameters such as error functions, weights or other data that can be used to guide the training of a model.

Certain audio event detection may use trained models that make a frame-by-frame level prediction of whether a particular audio frame corresponds to a desired audio event. Such frame level predictions may be processed to determine whether an audio event was detected (e.g., a prediction of whether the audio event is represented in the audio data) over a period of frames. One drawback to the frame-by-frame approach is that the variability of audio data may result in significant swings between predictions for individual audio frames. For example, for a system configured to assign a score to a particular audio frame, where the score represents a likelihood that the audio event is detected in the particular frame, scores may vary significantly from frame to frame depending on spikes or dips in the particular audio data of the respective frames. Such variation may make it difficult to perform audio event detection, as well as determine where an audio event started or ended.

Offered are techniques that improve audio event detection and can provide additional information such as information regarding the beginning and end of an event.

FIG. 1A illustrates a system for performing audio event detection according to embodiments of the present disclosure. Although the steps of FIG. 1A, and other figures below, are discussed in a particular order, unless expressly stated otherwise the order of operations may be changed and still be within the scope of the present disclosure. Further, as illustrated in FIG. 1A, the steps may be performed by a combination of one or more device(s) 110 and one or more server(s) 120, which may be connected over a network 199. As shown, a system may receive (130) audio data corresponding to a period of time (e.g., 30 seconds worth of audio data) and may process (132) the audio data into audio feature data using a first trained model. For example, the first trained model may be a convolutional recurrent neural network (CRNN), or other feature extractor such as feature extractor 610 discussed below. The system may process (134) a first portion of the audio feature data using a second trained model to determine a score and an adjusted time window. The second trained model may include a region proposal network (RPN) (such as RPN 620 discussed below) that is configured to process portions of audio feature data corresponding to preconfigured time intervals. The RPN may be configured to analyze audio feature data in the context of predetermined intervals of time, where each interval has a different length centered around a particular time point (e.g., audio frame). The RPN may determine scores for each interval of time across the period of time, where each score indicates how likely an audio event is detected during that interval of time. The RPN may also determine adjusted time intervals (And may output the begin time and end time of such adjusted time intervals) where the adjusted time intervals are based on the predetermined intervals, but are adjusted at the begin and/or end point to more closely coincide with the beginning and/or end of an audio event, as determined by the RPN.

The system may then determine (136) an adjusted first portion of the audio feature data corresponding to the adjusted window of time. For example, the system may take the begin point and end point of the adjusted window of time and determine the audio feature data that corresponds to those points. The system may then process (138) the adjusted first portion using a third model (such as a classifier 640 discussed below) to determine a score corresponding to a likelihood that an audio event is represented in the adjusted first portion of the audio feature data corresponding to the adjusted window of time (e.g., whether an audio event started at the begin point and ended at the end point of the adjusted window). The system may then determine (140) that the likelihood satisfies a condition (e.g., is above a threshold) and, if it is, cause (142) a particular action to be performed such as creating a notification of the audio event, logging the audio data or audio feature data corresponding to the audio event (as well as the start and end times), causing another command to be executed (e.g., turning on a light), or some other action.

FIG. 1B also illustrates a system for performing audio event detection according to embodiments of the present disclosure. In the techniques illustrated in FIG. 1B, audio data may be processed, using trained models, into subsampled data that has a coarser time scale (e.g., subsampled) than the raw audio data. The subsampled results may then be processed into a finer time scale (e.g., upsampled) that matches the original audio data. In this manner the system may determine upsampled data frames that match the time scale of the original audio data frames, only in creating the upsampled data frames the system may potentially remove certain spikes or other anomalies from the audio data. The individual frames of resulting (e.g., upsampled) data may then be scored based on a likelihood that an audio event is represented in a particular upsampled frame. The individual data frames may then be weighted and combined to create a weighted composite frame. The weighted composite frame is then scored to determine a likelihood that the audio data represents an audio event.

The subsampling involves processing input data (e.g., the audio data frames) into data of a different form and into a coarser time scale. Thus, as explained below in reference to FIGS. 5A and 5B, pairs of audio data frames may be subsampled such that a data frame resulting from sub sampling of a pair of audio data frames is a single subsampled data frame that is a combined representation corresponding to the time period of the two audio data frames. Further subsampling may also be done of such that a second layer of subsampled data frames is at a coarser time scale than a first layer of subsampled data frames, as explained below.

The upsampling involves processing input data (e.g., subsampled data frames) into data of a different form and into a finer time scale. Thus, as also explained below in reference to FIGS. 5A and 5B, subsampled data frames may combined in different ways and processed into resulting upsampled data frames that, as illustrated below, have the same time scale as the original audio data frames, only the resulting upsampled data frames include data that has been processed into different features, thus resulting in a different representation of the underlying audio than the audio data frames. Therefore, the final upsampled data frames may take into account information about the audio data at different time scales/resolutions, as explained in detail with regard to the combination of subsampled data frames in reference to FIG. 5B.

For example, the input audio data 302 may correspond to a time scale of each audio data frame representing 46 ms worth of audio. A first plurality of subsampled data frames (e.g., subsampled data frames 412 discussed below) may correspond to a coarser time scale, for example where each data frame of the first plurality corresponds 412 to 92 ms worth of audio. A second plurality of subsampled data frames (e.g., subsampled data frames 422) may correspond to an even coarser time scale, for example where each data frame of the second plurality 422 corresponds to 192 worth of audio. The upsampling process may create data frames (e.g., upsampled data frames 432) that correspond to the original time scale of the audio data 302 (e.g., where each data frame represents 46 ms worth of audio). While the upsampled data frames may correspond to the same time scale (e.g., where each incoming audio frame of the input audio data 302 has a corresponding upsampled data frame 432), the data in the upsampled data frame 432 may not match its counterpart audio data frame 302 as a result of the subsampling/upsampling processes where different subsampled data frames are used to create an eventual upsampled data frame.

As illustrated in FIG. 1B, a system may receive (130) audio data. The system may also process the audio data into audio feature data for purposes of the operations of FIG. 1B (and, e.g., for purposes of the operations discussed below in reference to FIGS. 4 and 5A-5B), but for present purposes the operations are discussed using audio data. As shown, the system may process (150) the audio data using a first model (such as a bi-directional RNN as discussed below in reference to FIGS. 4 and 5A-5B) to determine first subsampled data. The system may then process (152) the first subsampled data using a second model (such as another bi-directional RNN as discussed below in reference to FIGS. 4 and 5A-5B) to determine second subsampled data. The system may then process (154) the first subsampled data and second subsampled data (for example using an upsampling component 430 as discussed below in reference to FIGS. 4 and 5A-5B) to determine upsampled data frames. Although the upsampled data frames may represent the audio from the original audio data, and may have a similar time scale, the upsampled data frames may not necessarily be audio data frames as they may have undergone sufficient processing so not as to be playable to create coherent audio (though the upsampled data frames may be more useful for classification/determining presence of an audio event).

The system may process (156) each upsampled data frame using a classifier to determine a plurality of respective scores where each respective score indicates a likelihood that the respective upsampled data frame corresponds to an audio event. The system may then determine (158) a weighted composite data frame using the upsampled data frames and the respective scores. The system may then process (160) the weighted composite data frame using the classifier to determine an overall score corresponding to a likelihood that the audio event is represented in the original audio data (as indicated by scoring the weighted composite audio frame). The system may then determine (140) that the likelihood satisfies a condition (e.g., is above a threshold) and, if it is, cause (142) a particular action to be performed such as creating a notification of the audio event, logging the audio data or audio feature data corresponding to the audio event (as well as the start and end times), causing another command to be executed (e.g., turning on a light), or some other action.

As explained herein, various trained models may be used to do some of the processing to detect an audio event. In certain situations, the trained models may include a neural network. As illustrated in FIG. 2, a neural network may include a number of layers, from input layer 1 210 through output layer N 220. Each layer is configured to output a particular type of data and output another type of data. The neural network illustrated in FIG. 2 is configured to input data of type data A 202 (which is the input to layer 1 210) and output data of type data Z 208 (which is the output from the last layer N 220). The output from one layer is then taken as the input to the next layer. For example, the output data (data B 204) from layer 1 210 is the input data for layer 2 212 and so forth such that the input to layer N 220 is data Y 206 output from the penultimate layer (not shown). The form of the input data A 202 and output data Z 208 may be known, but the form of the intermediate data (e.g., data B 204, data 206, etc.) may not necessarily be known, which is a function of the operation of certain trained networks such as neural networks.

Figure 3:
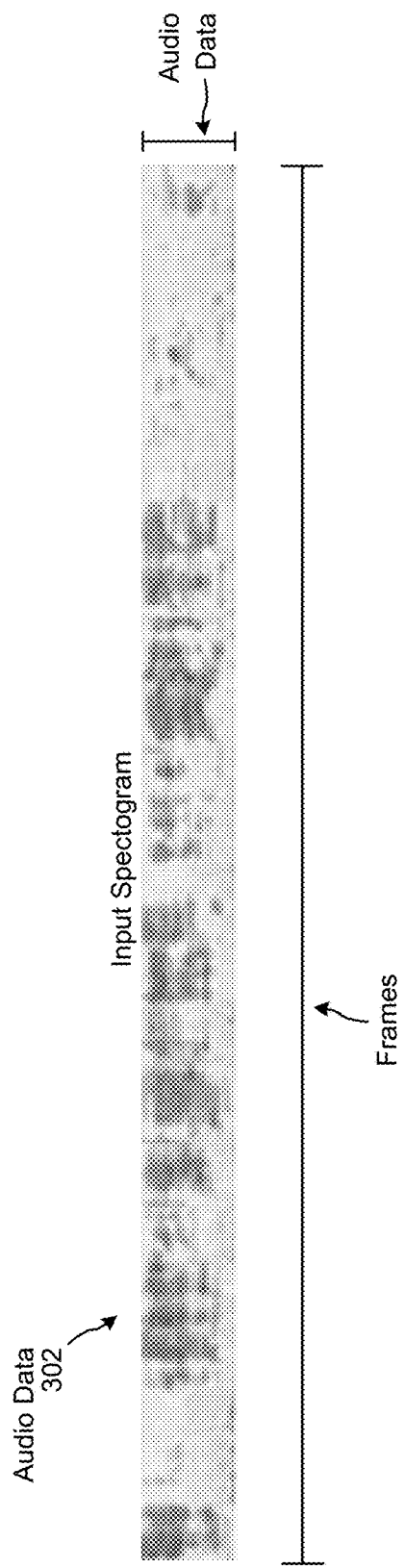
FIG. 3 illustrates an example of input audio data for use in detecting audio events according to embodiments of the present disclosure.

Audio data may be captured by a device 110 or by a combination of devices 110. The audio data may correspond to audio captured during a period of time that the system may wish to analyze for purposes of detecting an audio event at some point during that period of time. In one embodiment audio data may be time domain audio data as captured by one or more microphones. In another embodiment audio data may be frequency domain data as processed by one or more components. Audio data may come in a variety of different forms. For example, as illustrated in FIG. 3, input audio data 302 may correspond to an input spectrogram of a number of frames of data, with corresponding data for each frame. The input audio data 302 may include data regarding frequencies/energy of audio for a particular audio frame. An audio frame may, for example, correspond to 46 milliseconds of time, with a sliding window approach to capturing audio data, such that one frame overlaps with a neighboring frame for 23 milliseconds. Various approaches to frame size and capture may be used. In one example, an input spectrogram of audio data 302 may correspond to 1292 frames, with each frame corresponding to data for 64 dimensions of log filter bank energies (LFBEs). Thus, for each frame 64 data values exist and the values for all 1292 frames may be aggregated to form the input spectrogram.

Figure 4:
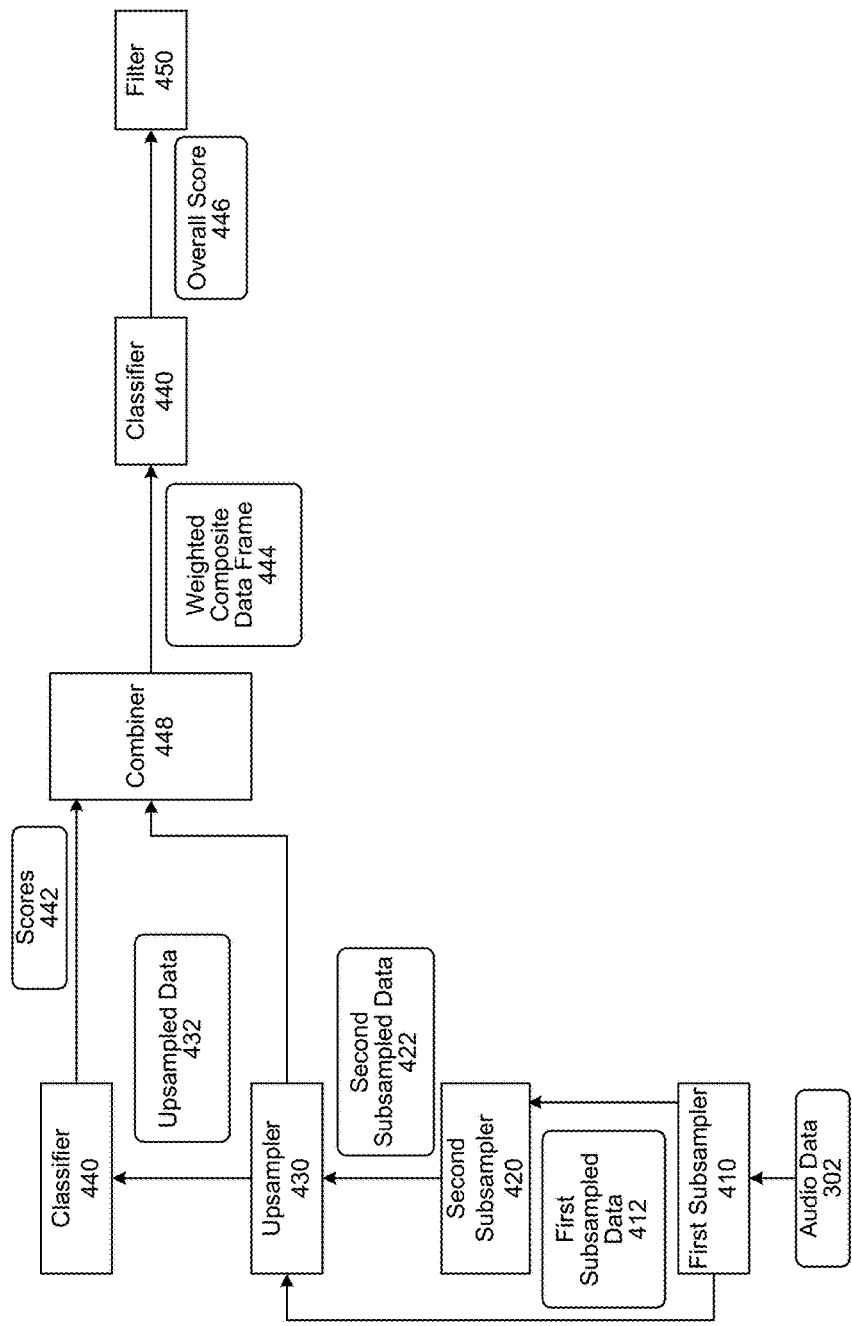
FIG. 4 is a conceptual diagram illustrating components for detecting audio events according to embodiments of the present disclosure.

Different instances of the same type of audio may occur with somewhat different speeds and durations, causing variations in input audio data corresponding to the particular event. To be robust to variations in the time axis, a system may use a multi-model subsampling and upsampling process as depicted in FIG. 4 and using techniques described in reference to FIG. 1B. As shown, the components of FIG. 4 may create subsampled audio data and then upsample the subsampled audio data to create upsampled audio frames that may be scored by a classifier (440) on a frame by frame basis to determine a likelihood that an audio event is detected.

As shown, audio data 302 (which may include a first plurality of audio frames) may be input into a first subsampler 410 which may subsample the individual frames of the audio data to create first subsampled data 412. The first subsampler 410 may include a first model such as a recurrent neural network (RNN) which may be a bi-directional RNN (bi-RNN). The bi-RNN architecture extracts certain features (which may be non-linear) from an audio data frame. The extracted features are included in the individual frames of subsampled data 412. The extracted features may depend on system configuration, but may include features that are configured when the bi-RNN of the first subsampler 410 is cross trained with the bi-RNN of the second subsampler 420 and/or the classifier 440. Thus, the specific features extracted by the bi-RNN are configured to coordinate performance of the other models of the system. The features may correspond to representations of the data in the audio data frame that was input into the bi-RNN.

The first subsampler 410 may also include an averaging component that averages pairs of post bi-RNN data frames. The output of the first subsampler 410 (the first plurality of subsampled data frames/subsampled data 412) may be input into a second subsampler 420 which then creates a second plurality of subsampled data frames/second subsampled data 422. The second subsampler 420 may include a second model, such as a second bi-directional RNN as well as a second averaging component that averages pairs of post bi-RNN data frames output from the second bi-RNN. The second bi-RNN of the second subsampler 420 may be configured similarly to the first bi-RNN of the first subsampler 410, and may extract the same or different features from those of the first bi-RNN depending on system configuration. The first subsampled data 412 and second subsampled data 422 may be input into an upsampler 430 that creates upsampled data frames 432. The upsampled data 432 may include a plurality of data frames, where the frames of the plurality of data frames have a same time resolution (e.g., time scale) as the frames of the first plurality (e.g., the frames of the original audio data 302).

Figure 5A:
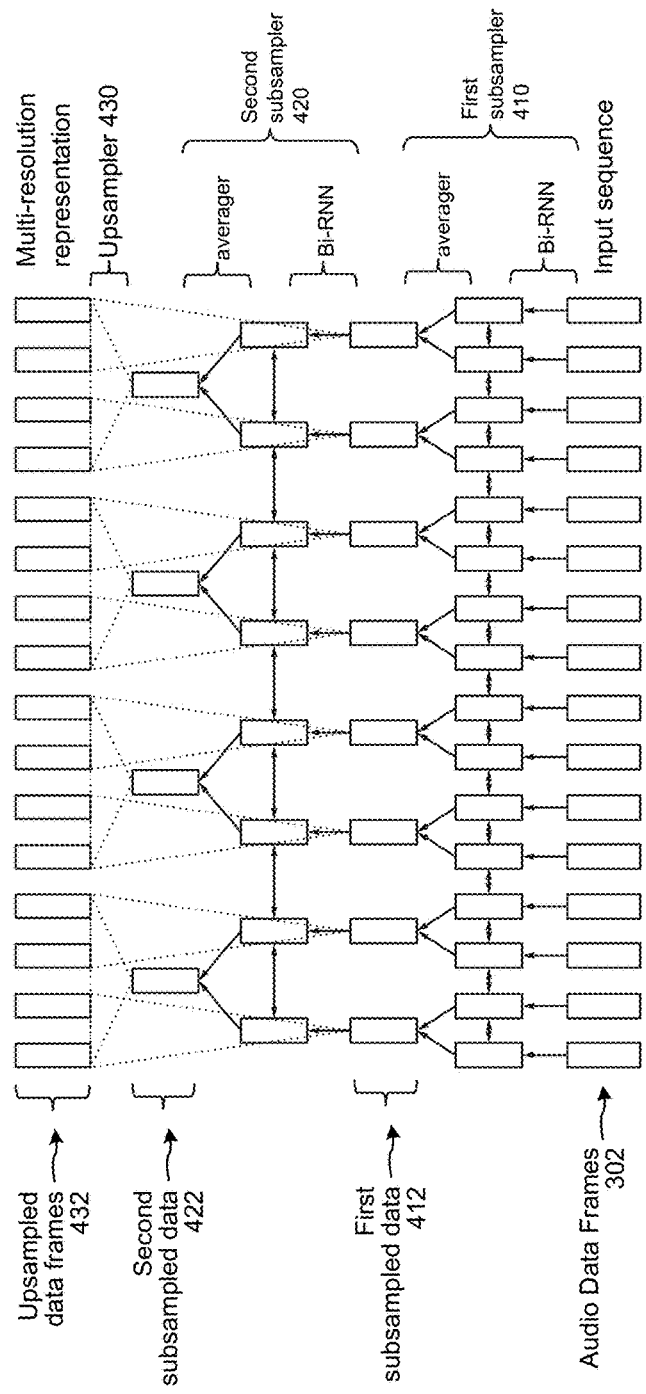

The resulting data from this processing is further illustrated in FIG. 5A. As shown, the input audio data frames 302 are processed by a first bi-RNN and then averaged (e.g., pairwise) to create first subsampled data 412, which may then be processed by a second bi-RNN and then averaged (e.g., pairwise) to create the second subsampled data 422. The upsampler 430 may then process the subsampled data to determine the upsampled data frames 432.

Thus, each layer (e.g., 410 and 420) may perform subsampling in the time axis with a rate of two, i.e., the outputs of the RNN cell for two neighboring frames are averaged together (e.g., by the averager within 410 and/or 420), and the resulting sequence, whose length is half of the input length of this layer, is then used as input to the next layer. In such a way, the higher recurrent layers effectively view the original utterance at coarser resolutions (larger time scales), and extract information from an increasingly larger context of the input.

After the last recurrent layer, the system obtains a representation for each of the input frames. This is achieved by upsampling (replicating) the subsampled output sequences from each recurrent layer, and summing them for corresponding frames. Therefore, the final frame representation produced by this architecture takes into account information at different resolutions.

For example, as further illustrated in FIG. 5B, the input sequence may include a first audio frame 552, a second audio frame 554, a third audio frame 556 and a fourth audio frame 558. The first bi-RNN of the first subsampler 410 may process the first audio frame 552 to determine a first data frame 553. The first bi-RNN of the first subsampler 410 may process the second audio frame 554 to determine a second data frame 555. The averager of the first subsampler 410 may average the first data frame 553 and the second data frame 555 (e.g., add their values and divide by two) to determine the first portion 560 (e.g., a first subsampled data frame) of the first subsampled data. The first subsampler 410 may similarly process (using the bi-RN and averager) the third audio frame 556 and fourth audio frame 558 to determine a second portion 562 (e.g., a second sub sampled data frame) of the first subsampled data.

The second bi-RNN of the second subsampler 420 may then process the first portion 560 of the first subsampled data to determine a third data frame 561. The second bi-RNN of the second subsampler 420 may process the second portion 562 of the first subsampled data to determine the fourth data frame 563. The averager of the second sub sampler 420 may average the third data frame 561 and the fourth data frame 563 (e.g., add their values and divide by two) to determine the first portion 564 (e.g., a third subsampled data frame) of the second subsampled data. The upsampler 430 may then determine a first upsampled data frame 566 (of the upsampled audio data frames 432) using the first portion 560 of the first subsampled data and the first portion 564 of the second subsampled data. To determine the first upsampled data frame 566, the upsampler 430 may add the first portion 560 of the first subsampled data and the first portion 564 of the second subsampled data. The next upsampled data frame, 567, may have the same values as the first upsampled data frame 566). The upsampler 430 may also determine another upsampled data frame 568 (of the upsampled audio data frames 432) using the second portion 562 of the first subsampled data and the first portion 564 of the second subsampled data. To determine the other upsampled data frame 566 (which may be referred to as a second upsampled data frame even if it is not necessarily the second upsample data frame in the upsampled data frame sequence 432), the upsampler 430 may add the second portion 562 of the first subsampled data and the first portion 564 of the second subsampled data. The next upsampled data frame, 569, may have the same values as upsampled data frame 568).

Although only two subsamplers 410 and 420 are illustrated, a different number of subsamplers may be used depending on system configuration. Further, depending on system configuration, frames may be subsampled at a different rate than pairwise (e.g., in groups of four, or some other number).

Each upsampled data frame 432 may include a plurality of data values representing certain data features of the particular frame. Thus, each frame may be represented by a vector of data Referred to as $[F_n]$ where n corresponds to a frame index (e.g., 0, 1, etc.). Each upsampled data frame 432 may also correspond to an individual input audio data frame 302 such that the time period (or frame index, etc.) for a particular upsampled frame 432 at the output corresponds to the time period (or frame index, etc.) for a particular input audio data frame 302 at the input.

Returning to FIG. 4, once the upsampled data frames 432 are determined, each frame may be processed by a classifier 440. The classifier may include a trained model that is configured to input a data frame and to output a score 442 indicating a likelihood that the respective frame corresponds to an audio event. Thus each frame may have a score $S_n$ where n corresponds to the frame index (e.g., 0, 1, etc.). Thus, each frame may have a data vector $[F_n]$ and score $S_n$. The data vectors may be included in the upsampled data 432 and the respective scores in score data 442. To obtain an overall score for the input audio data 302 (e.g., a score indicating whether an audio event is included in the time period corresponding to the input audio data 302), the system may combine the scores and data vectors in a manner that will allow an overall score to be determined.

For example, the system may weight each frame vector by its score. For example, a first upsampled data frame $[F_1]$ may be multiplied by its respective score $S_1$ to obtain a weighted upsampled data frame $[F_1]_w = S_1[F_1]$, a second upsampled data frame $[F_2]$ may be multiplied by its respective score $S_2$ to obtain a weighted upsampled data frame $[F_2]_w = S_2[F_2]$, and so on. The weighted upsampled data frames (for all frames 0 through N of the input audio data 302) may be summed together to determine composite upsampled frame data $[F]_{composite}$ as follows:

$$[F_{composite}] = \sum_{n=0}^{N} [F_n]_w$$

The scores of each frame may also be summed together to get a cumulative score $S_{cumulative} = S_1 + S_2 + \ldots S_N$. A weighted composite upsampled data frame 444 may thus be determined by dividing the composite upsampled frame data by the cumulative score, such that:

$$[F_{composite}]_w = \frac{[F_{composite}]}{S_{cumulative}}$$

The weighted composite upsampled data frame 444 may then be processed by the classifier 440 to determine an overall score 446 that corresponds to a likelihood that an audio event is included in the audio data 302. The combiner 448 may be used to determine the composite upsampled data frame and weighted composite upsampled data frame 444.

The system may employ a filter 450 to perform various operations using the overall score 446, for example checking to see if it satisfies a condition to determine if the score 446 is sufficient to declare that an event was detected. If the score above the threshold, the system may cause an action to be performed. The condition may be configurable. In one example, the condition may be if the score is high enough to exceed a threshold value. In another, the condition may be if the score is below a threshold value. In another, the condition may be if the score is within a certain range of values. Various other conditions may also be used. The action may depend on the type of event detected, various system or user preferences or configurations, etc.

Thus, as shown in FIG. 4 and FIG. 1B, the system may determine a likelihood that input audio data includes a desired audio event.

Once an event is detected (or even without an event being detected), the system may use the calculated individual frame scores 442 to determine where in the input audio data 302 an audio event is represented. A number of techniques may be used for this. In one example, the system may identify the highest scoring frame and determine that an audio event is located at the time of that particular frame. In another example, the system may determine a largest connected component, such as the largest block of score values greater than a certain threshold (e.g., 0.5). Once those values are determined, the system may determine which upsampled data frames 432 correspond to those scores, and then which input audio data frames correspond to the time period of those upsampled data frames, thus identifying the location of the audio event. Other techniques may also be used.

As shown in FIG. 1A and discussed further below with regard to FIG. 6 and other figures, the system may also use another technique to determine a likelihood that input audio data includes a desired audio event. That technique may also include determining a likely start and end time for the audio event.

Figure 6:
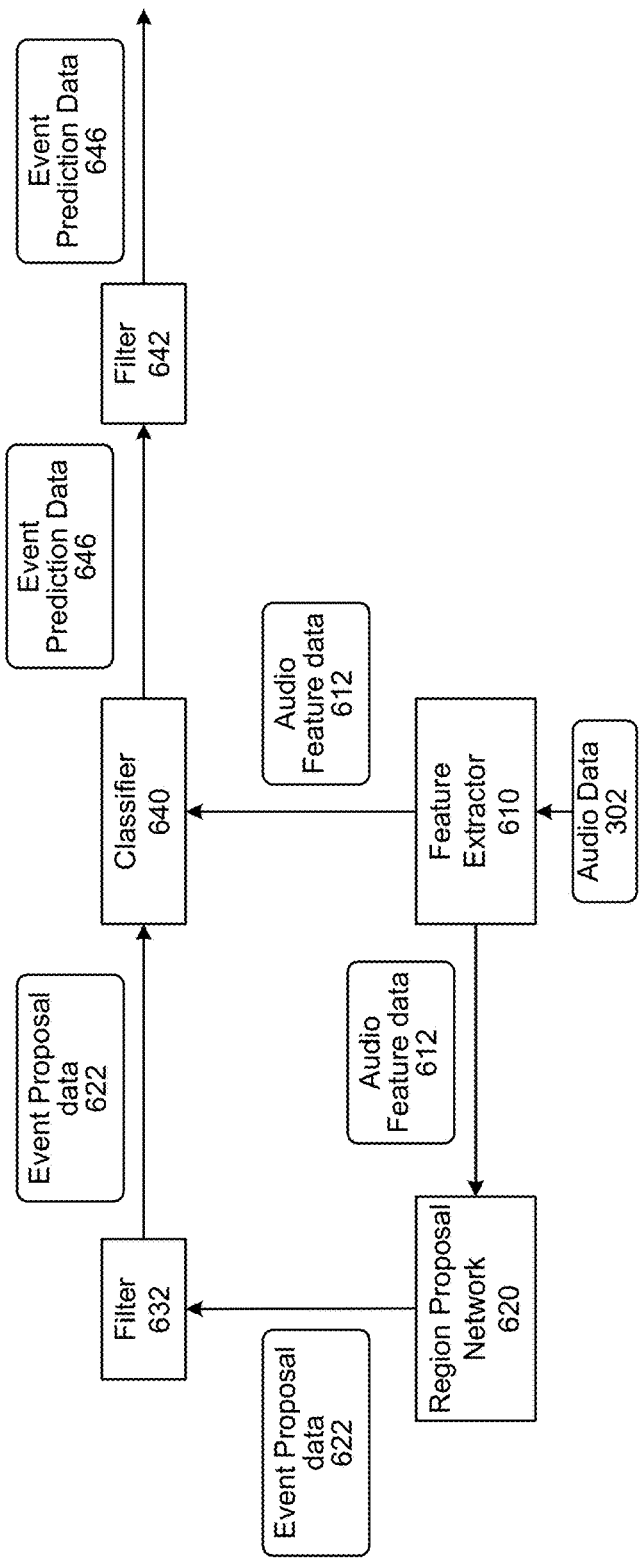
FIG. 6 is a conceptual diagram illustrating components for detecting audio events according to embodiments of the present disclosure.
Figure 7:
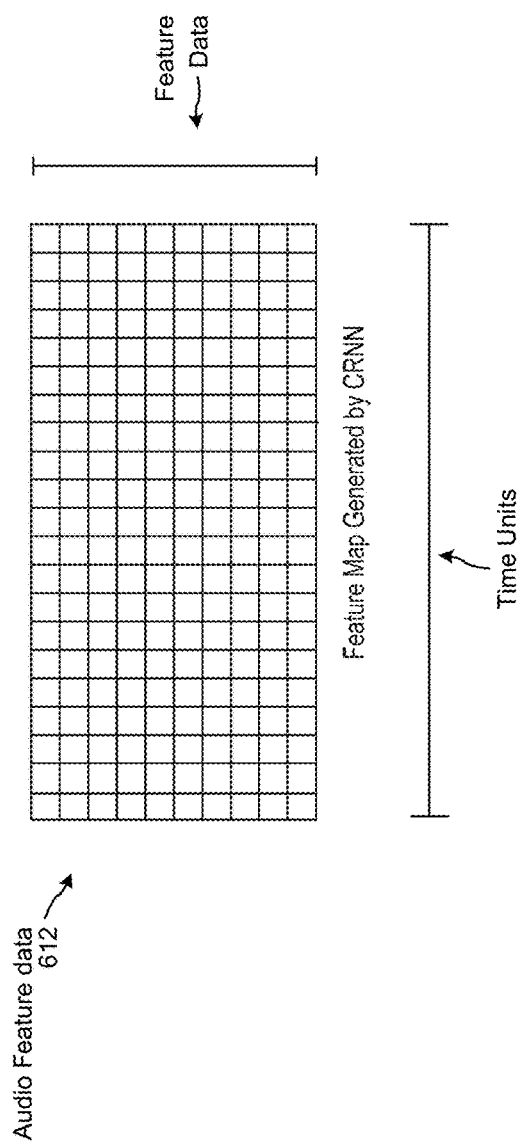
FIG. 7 is a conceptual diagram of audio feature data for detecting audio events according to embodiments of the present disclosure.

As discussed with FIG. 1A, and illustrated in FIG. 6, input audio data 302 may be processed by a first model, such as a feature extractor 610 to determine audio feature data 612. The feature extractor 610 may be configured to extract, from the input audio data 302, feature data corresponding to features that may be relevant to audio classification and/or other operations performed by other components (such as classifier 640, region proposal network 620, or the like). The feature extractor 610 may include a convolutional recurrent neural network (CRNN), convolutional neural network (CNN), other neural network, or other trained model acting as a feature extractor. As shown in FIG. 7, the audio feature data 612 may correspond to a two dimensional feature map where one dimension corresponds to time and another dimension corresponds to feature data. Thus, for each time unit of feature data (e.g., each column shown in FIG. 7) will include a number of feature data values (e.g., each row shown in FIG. 7) for that time unit. Thus the audio feature data 612 may track a certain number of dimensions worth of feature data for each time unit. The resolution of each time unit for the audio feature data 612 (e.g., the time duration associated with each particular column shown in FIG. 7) may not necessarily be the same as the original input audio data 302. For example, one time unit (e.g., one column worth) of the audio feature data 612 may correspond to a longer time duration than an original 46 millisecond audio frame (which may be the time unit for audio data 302). Thus, there may not be a one-to-one relationship between a unit of audio data 302 and a unit of audio feature data 612. (Although in certain system configurations there may be.) For example, one time unit of the audio feature data 612 may correspond to eight audio data, four audio data frames, some time unit that does not correspond to an integer number of audio frames, etc. As can be appreciated, various such time units are possible using the system. Thus each time unit of audio feature data 612 may include data corresponding to many different original audio data frames. The time scale may depend on system configuration, for example configuration of the feature extractor 610, classifier 640 and/or RPN 620. Although FIG. 7 illustrates one example configuration of audio feature data 612, other configurations of audio feature data 612 may also be used. Audio feature data 612 may be data in a time domain or frequency domain, may include binned data according to frequency ranges or time ranges, may include different configurations of features, etc. Configuration of the audio feature data 612 may also depend on configuration of the feature extractor 610, classifier 640 and/or RPN 620.

The feature data of 612 may correspond to values in feature dimensions that may be used by other models (such as RPN 620 and/or classifier 640) in performing further operations. In certain instances the feature extractor 610 may be trained with the RPN 620 and/or classifier 640 so that the feature extractor 610 learns the feature data most useful to the later operations.

Figure 8:
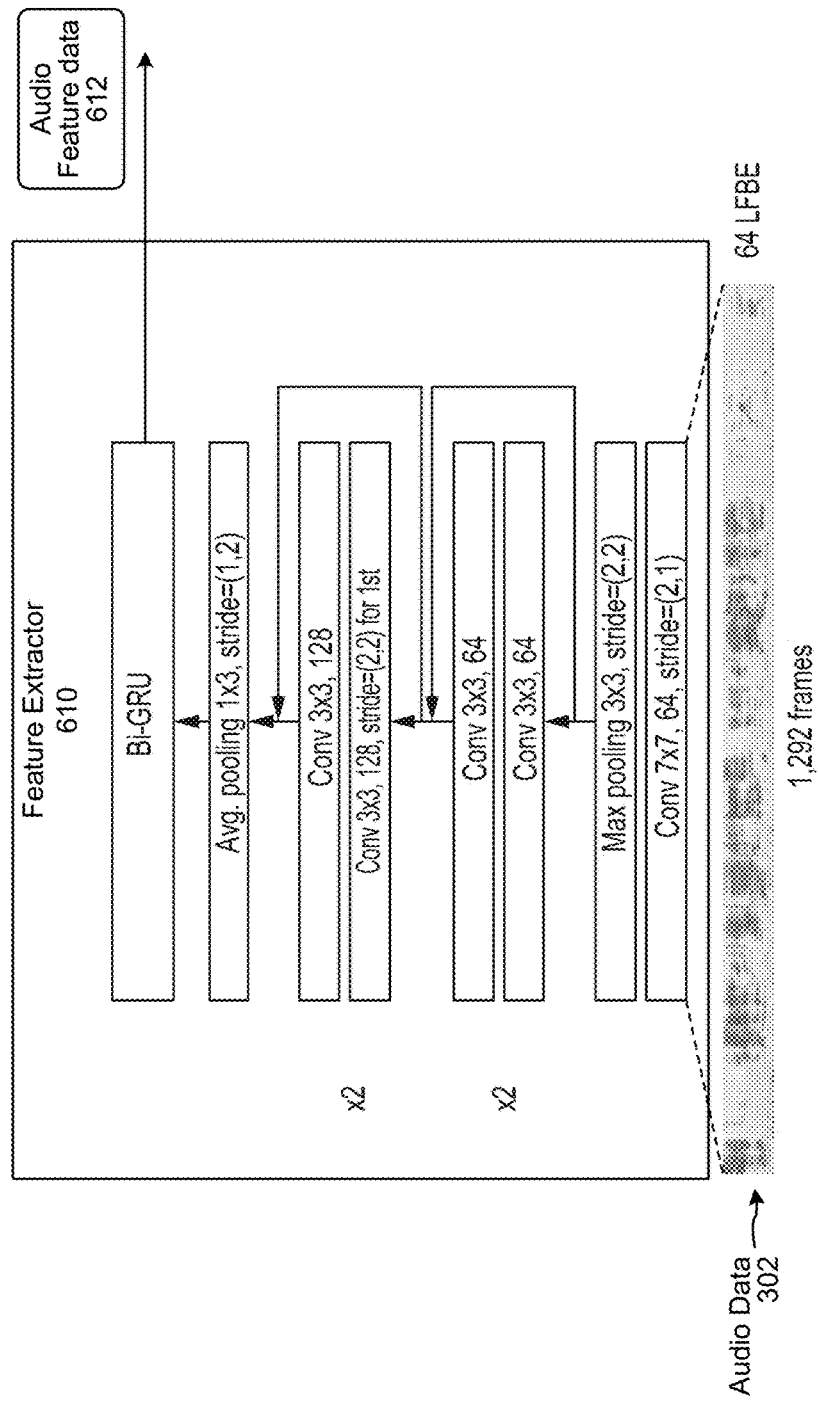
FIG. 8 is a conceptual diagram of a component configured to process audio data into audio feature data for detecting audio events according to embodiments of the present disclosure.

To produce the audio feature data 612, the feature extractor 610 may be configured as a CRNN as illustrated in FIG. 8. A residual network structure may be used as the convolutional network in the feature extractor CRNN, which may include two convolutional blocks. As shown in FIG. 8, the feature extractor CRNN may include a number of layers. A bottom convolutional layer may input the audio data 302 and with a stride of (2,1) (meaning the layer may skip an output every two timestamps). The CRNN then may have a max pooling layer with a stride of (2,2) resulting in a 2× time dimensionality reduction and a 2× frequency reduction. The result of the max pooling is then processed by the next two convolutional blocks/residual network blocks (e.g., Cony 3×3, 64), the output of which is then processed by the next two convolutional blocks (Cony 3×3, 128). An average pooling block may then be used to further reduce the dimensionality before feeding into a bi-directional gated recurrent unit (GRU) layer to produce the audio feature data 612. As noted, the audio feature data 612 may have a time scale of 186 ms, e.g., eight times the resolution of the input spectrogram. The number of units in the feature data may correspond to the number of units in the bi-directional GRU layer of the CRNN.

Figure 9:
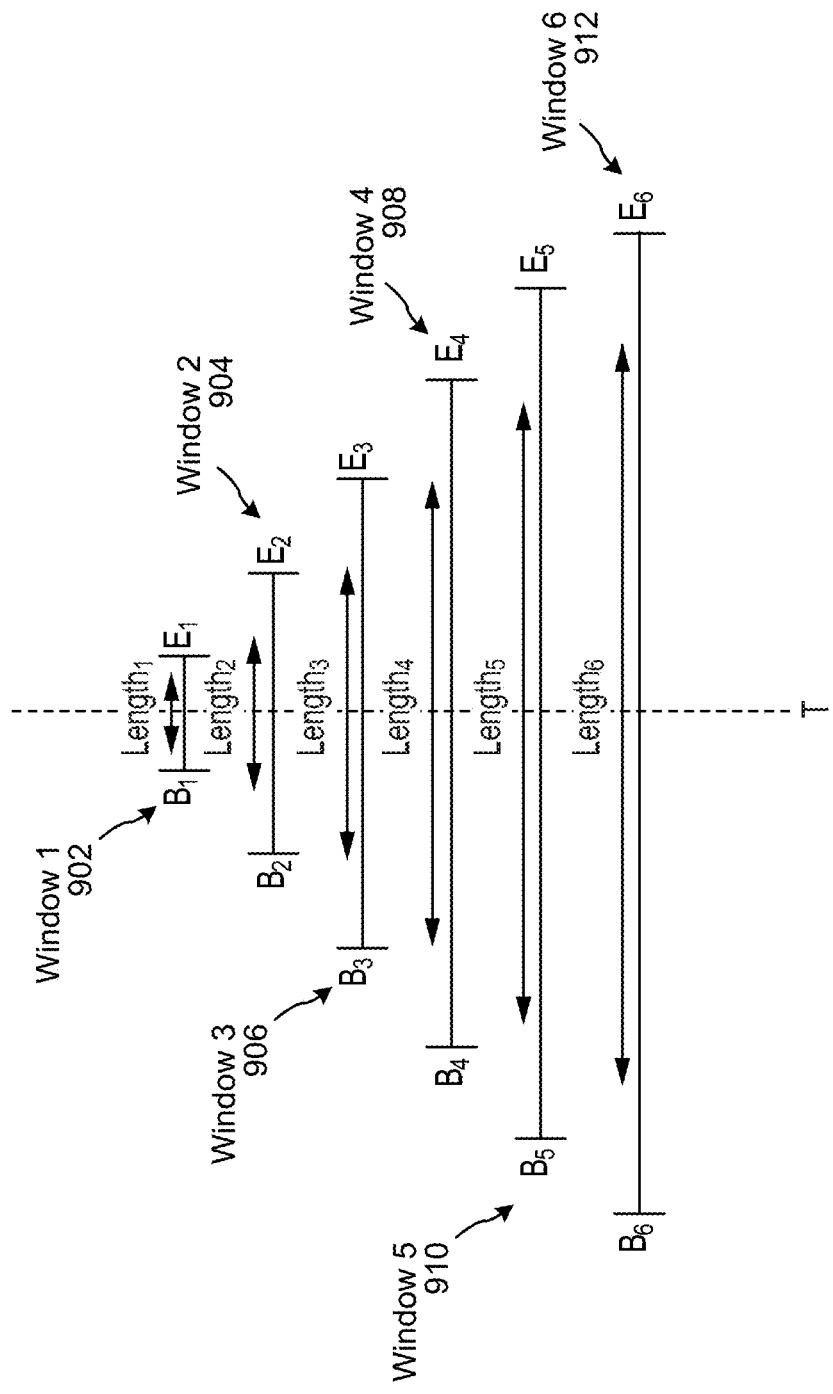
FIG. 9 is a conceptual diagram of preconfigured interval lengths detecting audio events according to embodiments of the present disclosure.

Returning to FIG. 6, the audio feature data 612 may be fed into both a region proposal network 620 and into a classifier 640. Turning first to the region proposal network (RPN) 620, the RPN 620 may include a trained model configured to analyze audio feature data in the context of a number of preconfigured time intervals to determine if an audio event is likely within one or more of the time intervals (either as originally preconfigured or as adjusted). For example, an RPN 620 may be configured to take any particular point in time T and evaluate the audio feature data for certain windows around T to determine if any of those windows may correspond to an audio event. As shown in FIG. 9, for example, an RPN 620 may be configured, for a particular time point T, to evaluate segments of audio feature data for six window lengths centered at time T, for example window 1 902, window 2 904, window 3 906, window 4 908, window 5 910, and window 6 912. Each window corresponds to a particular preconfigured length of time (e.g., length 1, length 2, etc.) where the RPN 620 is trained to evaluate segments of data for the windows having the appropriate length (thus the lengths are pre-configured to the runtime processing performed by the RPN). In one example, the length intervals may be 1, 2, 4, 8, 16, and 32 frames/data segments long. Each window may be centered on a particular time T such that the beginning coordinate (e.g., $B_1$, $B_2$, etc.) of a particular window to be evaluated is equidistant from the center time T as the ending coordinate (e.g., $E_1$, $E_2$, etc.) of a particular window to be evaluated. The coordinates may be of varying degrees of precision and may be expressed as frames, milliseconds, or in some other unit, particularly in relation to coordinates for adjusted time windows as discussed below.

Figure 10:
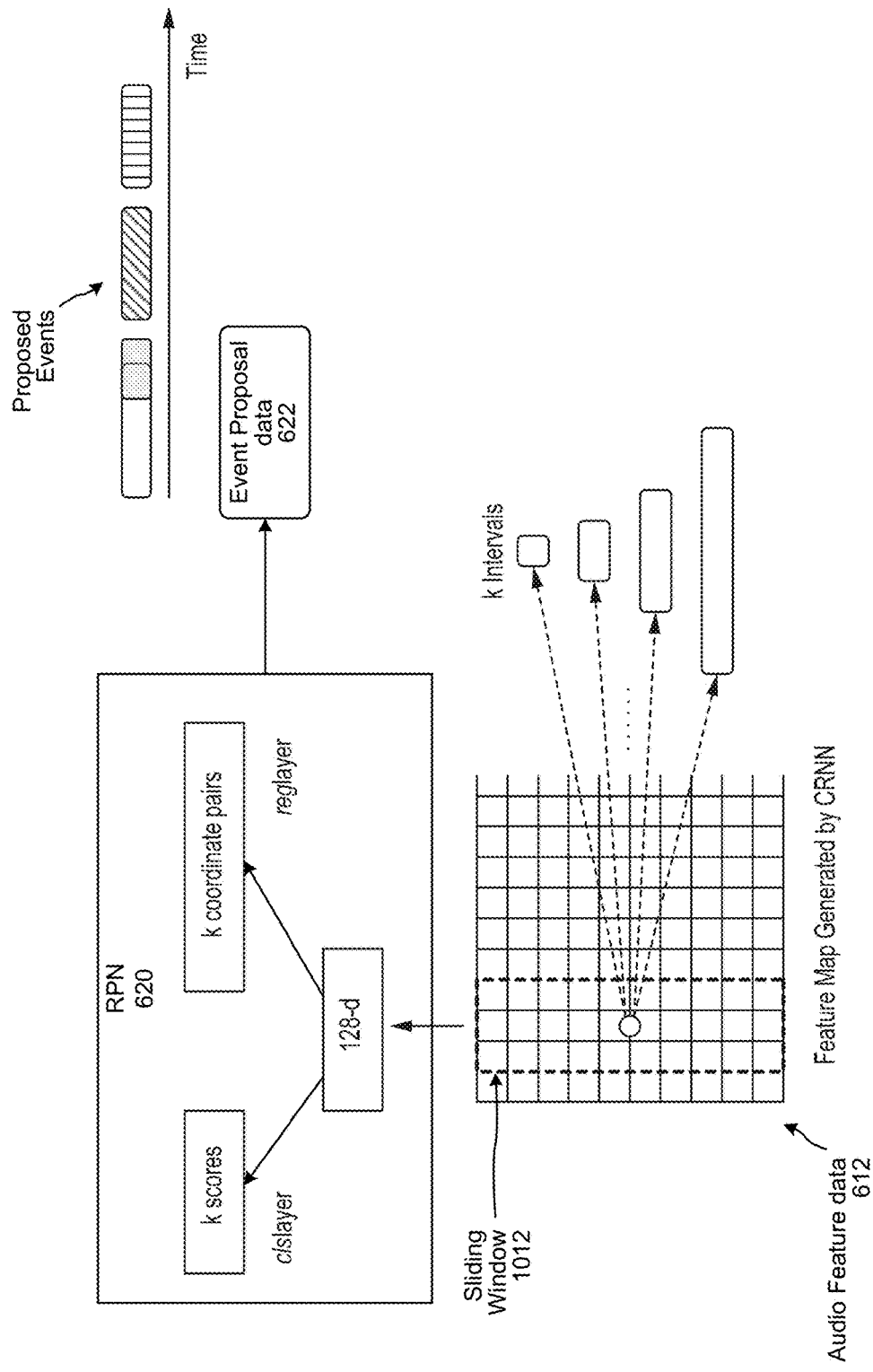
FIG. 10 is a conceptual diagram of a component configured to use audio feature data to propose potential detected audio events according to embodiments of the present disclosure.

To evaluate a particular window's worth of audio feature data the RPN 620 may identify the time T within the audio feature data 612 and may process a sliding window's worth of data surrounding the time T. For example, as shown in FIG. 10, the RPN 620 may evaluate a sliding window's worth of (e.g., a portion of the audio feature data 612), where the sliding window 1012 is centered on a time T. The RPN 620 may map the feature data into a lower-dimensional (e.g., 128 dimensional) feature. The size of the sliding window 1012 may be, for example, n×3 where n is the height of the feature map 612. The receptive field of the sliding window may be 557 ms (3×8×frame shift) but may actually include contextual information from intervals longer than 557 ms as the feature extractor 610 may include a recurrent layer. The sliding window 1012 may be a fixed sized window to be used for each potential interval to be evaluated, or may be adjusted for different interval sizes (e.g., a longer sliding window's worth of audio frame data may be used for a longer interval).

For each time T, the RPN 620 may evaluate the sliding window of data in the context of the preconfigured length intervals (e.g., the intervals illustrated in FIG. 9). The RPN 620 may then output, for each interval, an indicator of the window, e.g., coordinates of an adjusted interval proposal (such as a beginning and end time that may be slightly shifted from the original interval) as well as a score indicating a likelihood that the adjusted window corresponds to an audio event. As shown in FIG. 10, the 128-d feature of the sliding window at each location time T is fed into one dense layer (cls layer) to predict scores corresponding to a likelihood of whether an audio event is detected and another dense layer (reg layer) to encode the indicators of the interval proposals. Such an evaluation may occur across all time points T of the audio feature data 612. Thus, if the RPN is configured to analyze k intervals for each time T, the RPN 620 may analyze and score k*T potential intervals of the audio feature data 612 in order to determine if an audio event is detected. If 200 time points are included in the feature map generated by the CRNN, and the RPN is configured to analyze six intervals per time point, the RPN 620 may generate 1200 adjusted event proposal windows, each with a corresponding score. Thus, the event proposal data 622 output by the RPN 620 may include a series of indicators corresponding to adjusted time windows and corresponding scores. The indicators corresponding to the time windows (either adjusted or original) may include, for example, start and end coordinates for each respective time window. For example, the event proposal data 622 may include scores and beginning/ending coordinates: $[S_1,B_1,E_1],[S_2,B_2,E_2]$, etc. where the beginning and ending coordinates (B, E) correspond to adjusted time windows as determined by the RPN. Alternatively, an indicator of a window (which may be referred to as time data, time window data, etc.) may include a center time of a window plus the length of the window (thus allowing a downstream component to determine the start/end of the window). Alternatively, an indicator of a window may include a start coordinate of the window plus the length of the window (thus allowing a downstream component to determine the end of the window). Other forms of such indicators may also be used.

As shown in FIG. 6, the system may employ a filter 632 to only pass the top scoring adjusted time windows (e.g., the top 50 or top 100) to the classifier 640. The filter may also employ non-maximum suppression (NMS) or other techniques to avoid passing to the classifier candidate time windows that may substantially overlap. For example, the filter 632 may evaluate incoming candidate adjusted time windows in the event proposal data 622 against each other to make sure that individual candidate time windows are sufficiently independent from each other. Once the candidate adjusted time windows have been filtered, the indicators corresponding to the adjusted time windows are then passed to the classifier 640 as event proposal data 622. The event proposal data 622 may not include the scores for the time windows as determined by the RPN, as those scores would not necessarily be used by the classifier 640.

The classifier 640 may then independently evaluate the audio feature data 612 corresponding to the top candidate time windows (e.g., adjusted time windows) to score them, thus determining a likelihood than an audio event corresponds to each respective adjusted time window. The classifier 640 thus takes as input the audio feature data 612 as well as the indicators for the top candidate time windows as determined by and output by the RPN 620 and filter 632 (in the form of event proposal data 622).

Figure 11:
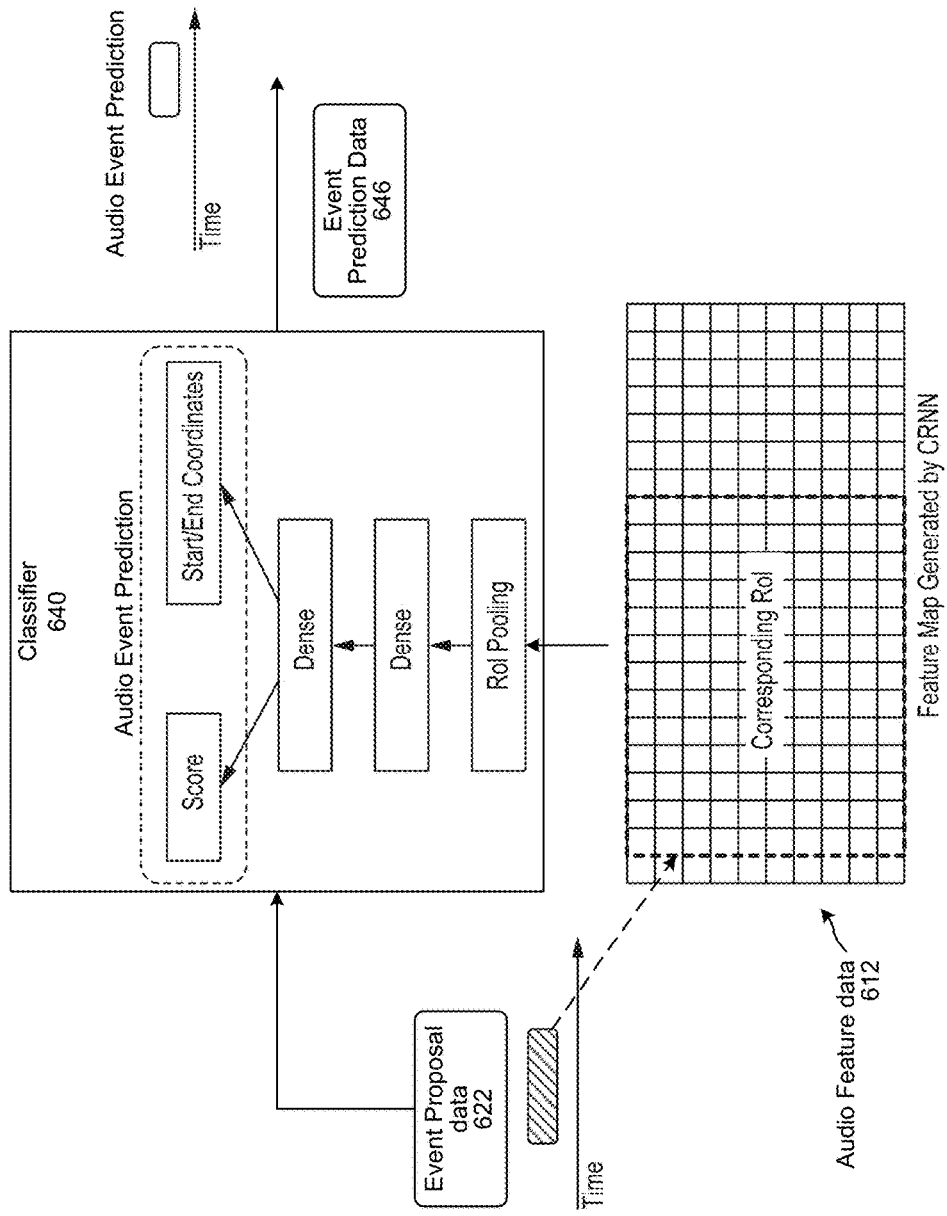
FIG. 11 is a conceptual diagram of a component configured use audio feature data and proposed potential audio event intervals for detecting audio events according to embodiments of the present disclosure.

As shown in FIG. 11, for each adjusted time window input to the classifier 640, the classifier 640 will determine the region of interest (RoI) of the audio feature data 612 corresponding to the adjusted time window. The classifier will then pool the audio feature data from the RoI to generate a fixed length feature vector. (This may be done to ensure the input to the dense layers is the same size regardless of the size of the RoI, which may vary depending on the preconfigured interval length that led to the particular candidate window under consideration.) This fixed-length feature vector may then be fed into two dense layers (each with M nodes), followed by two output layers, one that outputs a score and one that outputs refined start/end coordinates or another indicator for the respective window. The indicator for the window output by the classifier 640 may also be adjusted from what was input to the classifier as the classifier may be configured to adjust the time windows based on its own operations.

The score output by the classifier 640 corresponds to the likelihood that the particular window includes an audio event. The classifier may then output event prediction data 646 which may include refined window indicators and the respective window's corresponding scores. Returning to FIG. 6, the system may employ another filter 642 to employ non-maximum suppression (NMS) or other techniques to remove post-classifier time windows that may substantially overlap. The filter 642 may also compare the incoming scores to a particular configurable threshold (e.g., 0.8) and may remove any candidate windows with post-classifier scores that do not satisfy the threshold. The filter 642 (or other component) may be configured to output an N-best of candidate windows or may be configured to only output the top scoring candidate window.

Thus, a feature extractor 610 may receive (130) audio data corresponding to a period of time and process (132) the audio data into audio feature data. The RPN 620 may receive the audio feature data and determine a first portion of the audio feature data corresponding to a first time window within the period of time, where the first time window has a pre-configured length of time. The RPN 620 may process (134) the first portion to determine a first score and an adjusted first time window. The RPN 620 may send the indicator of the adjusted time window to the classifier 640. The classifier 640 may determine (136) an adjusted first portion of the audio feature data corresponding to the adjusted time window and may process (138) the adjusted first portion to determine a second score corresponding to a likelihood that an audio event occurred during the adjusted first time window. The filter 642 may determine (140) the second score is above a threshold and the system may then cause (142) an action to be performed in response to the second score being above the threshold.

In certain configurations a particular classifier 640 may be trained to detect a certain kind of audio event (e.g., a baby crying, window breaking, etc.). Thus, a different classifier 640 may be needed to analyze audio frame data for different types of audio events. The RPN 620, however, may be event-type agnostic, thus allowing the system to use the data generated by an RPN 620 by many different event-specific classifiers.

Further, the techniques and components of FIG. 1B/FIG. 4 and FIG. 1A/FIG. 6 may be used together to detect the boundaries of audio events in stored audio data. The techniques of FIG. 1B/FIG. 4 may be used as a first pass over segments of audio data to determine a likelihood that an audio event is represented in the segment(s) of audio data. If an audio event is detected (e.g., the score determined by classifier 440 is above a threshold, the segment of audio data may be processed according to the techniques of FIG. 1A/FIG. 6 to determine the coordinates of audio data that correspond to the event. Such coordinates may then be stored, thus allowing the system to mine and catalog stored audio data for particular audio events.

The system may be configured to incorporate user permissions and may only perform activities disclosed herein if approved by a user. As such, the systems, devices, components, and techniques described herein would be typically configured to restrict processing where appropriate and only process user information in a manner that ensures compliance with all appropriate laws, regulations, standards, and the like. The system and techniques can be implemented on a geographic basis to ensure compliance with laws in various jurisdictions and entities in which the components of the system and/or user are located.

Figure 12:
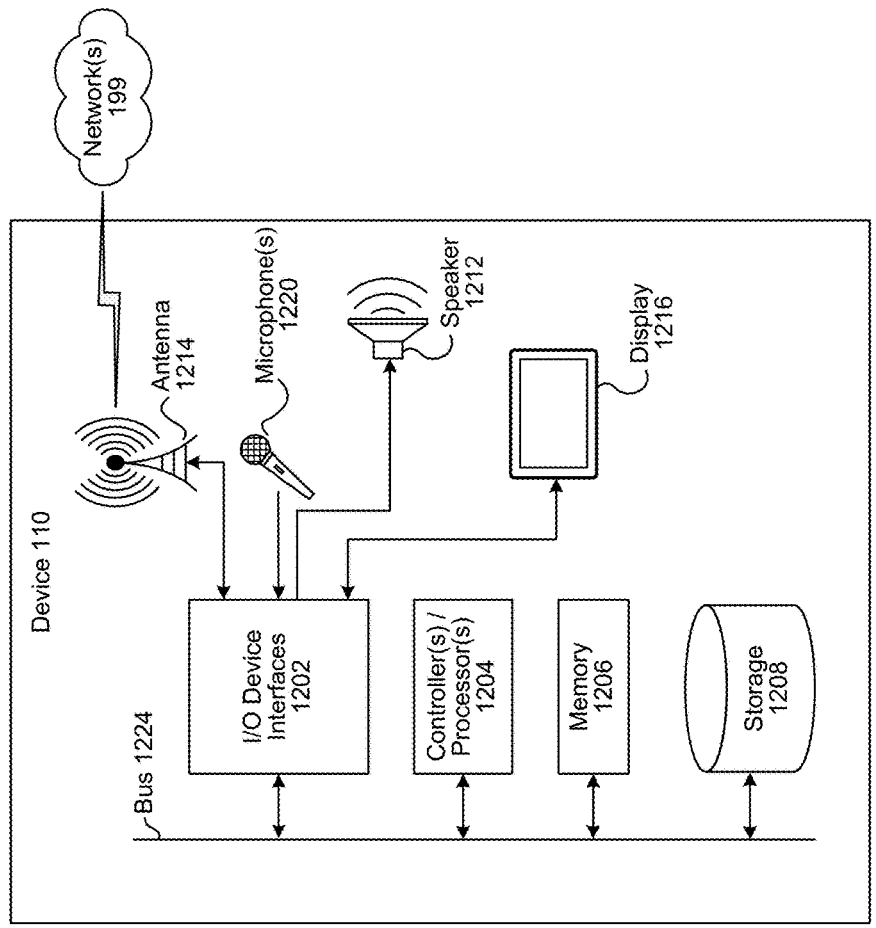
FIG. 12 is a block diagram conceptually illustrating example components of a device according to embodiments of the present disclosure.
Figure 13:
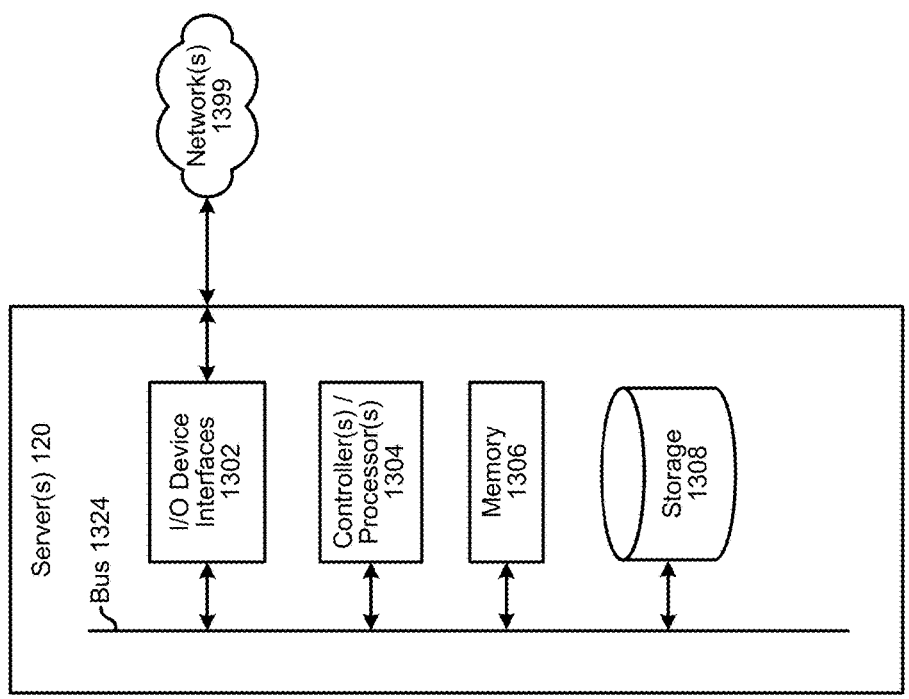
FIG. 13 is a block diagram conceptually illustrating example components of a server according to embodiments of the present disclosure.

FIG. 12 is a block diagram conceptually illustrating a device 110 that may be used with the system. FIG. 13 is a block diagram conceptually illustrating example components of a remote device, such as the server(s) 120. Either the device 110, the server(s) 120, or some combination thereof may perform the audio event detection as described herein. The term "server" as used herein may refer to a traditional server as understood in a server/client computing structure but may also refer to a number of different computing components that may assist with the operations discussed herein. For example, a server may include one or more physical computing components (such as a rack server) that are connected to other devices/components either physically and/or over a network and is capable of performing computing operations. A server may also include one or more virtual machines that emulates a computer system and is run on one or across multiple devices. A server may also include other combinations of hardware, software, firmware, or the like to perform operations discussed herein. The server(s) may be configured to operate using one or more of a client-server model, a computer bureau model, grid computing techniques, fog computing techniques, mainframe techniques, utility computing techniques, a peer-to-peer model, sandbox techniques, or other computing techniques.

Multiple servers (120) may be included in the system, such as one or more servers 120 for performing various operations. In operation, each of these devices (or groups of devices) may include computer-readable and computer-executable instructions that reside on the respective device (110/120), as will be discussed further below.

Each of these devices (110/120) may include one or more controllers/processors (1204/1304), which may each include a central processing unit (CPU) for processing data and computer-readable instructions, and a memory (1206/1306) for storing data and instructions of the respective device. The memories (1206/1306) may individually include volatile random access memory (RAM), non-volatile read only memory (ROM), non-volatile magnetoresistive memory (MRAM), and/or other types of memory. Each device (110/120) may also include a data storage component (1208/1308) for storing data and controller/processor-executable instructions. Each data storage component (1208/1308) may individually include one or more non-volatile storage types such as magnetic storage, optical storage, solid-state storage, etc. Each device (110/120) may also be connected to removable or external non-volatile memory and/or storage (such as a removable memory card, memory key drive, networked storage, etc.) through respective input/output device interfaces (1202/1302).

Computer instructions for operating each device (110/120) and its various components may be executed by the respective device's controller(s)/processor(s) (1204/1304), using the memory (1206/1306) as temporary "working" storage at runtime. A device's computer instructions may be stored in a non-transitory manner in non-volatile memory (1206/1306), storage (1208/1308), or an external device(s). Alternatively, some or all of the executable instructions may be embedded in hardware or firmware on the respective device in addition to or instead of software.

Each device (110/120) includes input/output device interfaces (1202/1302). A variety of components may be connected through the input/output device interfaces (1202/1302), as will be discussed further below. Additionally, each device (110/120) may include an address/data bus (1224/1324) for conveying data among components of the respective device. Each component within a device (110/120) may also be directly connected to other components in addition to (or instead of) being connected to other components across the bus (1224/1324).

Referring to FIG. 12, the device 110 may include input/output device interfaces 1202 that connect to a variety of components such as an audio output component such as a speaker 1212, a wired headset or a wireless headset (not illustrated), or other component capable of outputting audio. The device 110 may also include an audio capture component. The audio capture component may be, for example, a microphone 1220 or array of microphones, a wired headset or a wireless headset (not illustrated), etc. If an array of microphones is included, approximate distance to a sound's point of origin may be determined by audio localization based on time and amplitude differences between sounds captured by different microphones of the array. The device 110 may additionally include a display 1216 for displaying content. The device 110 may further include a camera 1218. One or more device(s) 110 may capture audio data that may be used for purposes of audio event detection as described herein. The audio captured, and resulting audio data, may be used as described herein to detect and locate (for example within the audio data) a representation of an audio event.

Via antenna(s) 1214, the input/output device interfaces 1202 may connect to one or more networks 199 via a wireless local area network (WLAN) (such as WiFi) radio, Bluetooth, and/or wireless network radio, such as a radio capable of communication with a wireless communication network such as a Long Term Evolution (LTE) network, WiMAX network, 3G network, 4G network, 5G network, etc. A wired connection such as Ethernet may also be supported. Through the network(s) 199, the system may be distributed across a networked environment. The I/O device interface (1202/1302) may also include communication components that allow data to be exchanged between devices such as different physical servers in a collection of servers or other components.

The components of the device(s) 110 or the server(s) 120 may include their own dedicated processors, memory, and/or storage. Alternatively, one or more of the components of the device(s) 110 or the server(s) 120 may utilize the I/O interfaces (1202/1302), processor(s) (1204/1304), memory (1206/1306), and/or storage (1208/1308) of the device(s) 110 or server(s) 120, respectively.

As noted above, multiple devices may be employed in a single system. In such a multi-device system, each of the devices may include different components for performing different aspects of the system's processing. The multiple devices may include overlapping components. The components of the device 110 and the server(s) 120 as described herein, are illustrative, and may be located as a stand-alone device or may be included, in whole or in part, as a component of a larger device or system.

Figure 14:
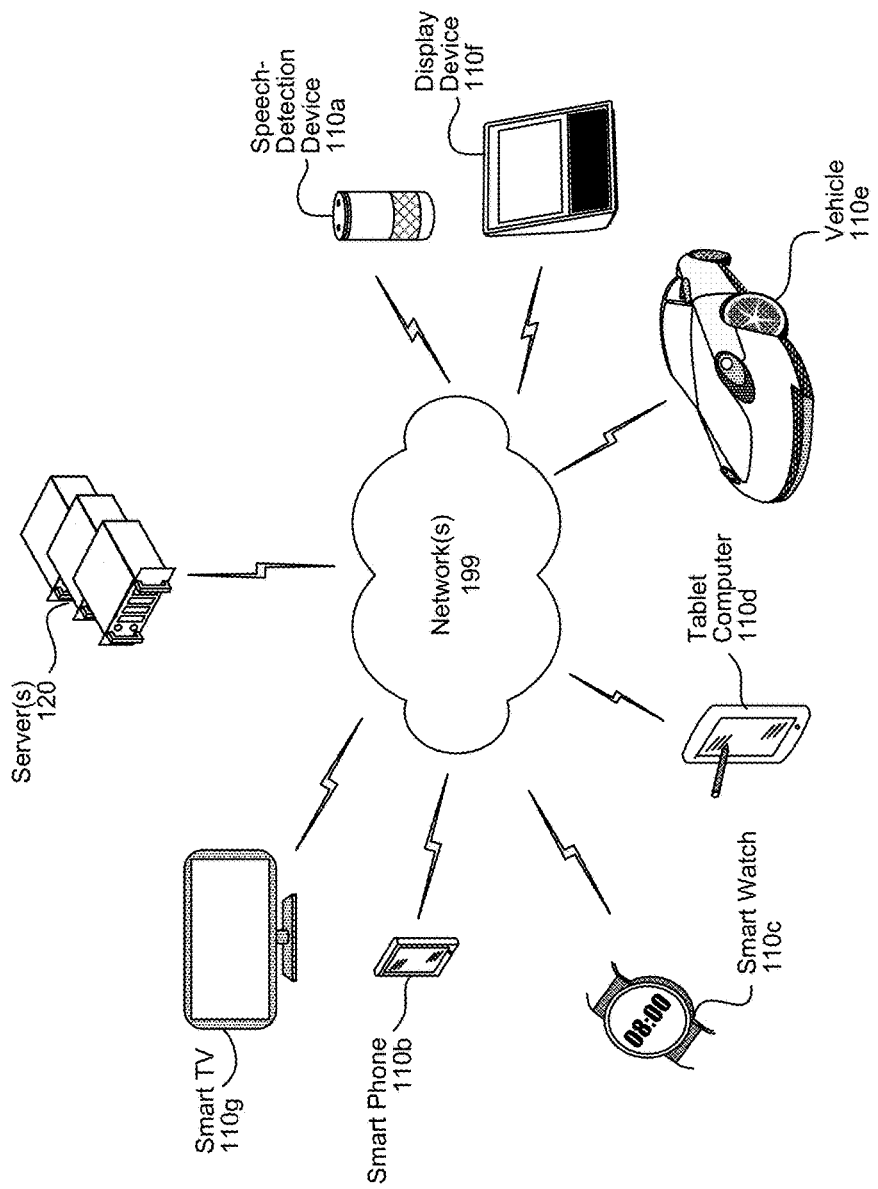
FIG. 14 illustrates an example of a computer network for use with the speech processing system.

As illustrated in FIG. 14, multiple devices (110a-110g, 120) may contain components of the system and the devices may be connected over a network(s) 199. The network(s) 199 may include a local or private network or may include a wide network such as the Internet. Devices may be connected to the network(s) 199 through either wired or wireless connections. For example, a speech-detection device 110a, a smart phone 110b, a smart watch 110c, a tablet computer 110d, a vehicle 110e, a display device 110f, and/or a smart television 110g may be connected to the network(s) 199 through a wireless service provider, over a WiFi or cellular network connection, or the like. Other devices are included as network-connected support devices, such as the server(s) 120, and/or others. The support devices may connect to the network(s) 199 through a wired connection or wireless connection. Networked devices may capture audio using one-or-more built-in or connected microphones or other audio capture devices, with processing one or more servers 120.

The components discussed above may be operated as software, hardware, firmware, or some other combination of computing components.

The concepts disclosed herein may be applied within a number of different devices and computer systems, including, for example, general-purpose computing systems, speech processing systems, and distributed computing environments.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of computers and speech processing should recognize that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage medium may be implemented by a volatile computer memory, non-volatile computer memory, hard drive, solid-state memory, flash drive, removable disk, and/or other media.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements, and/or steps are in any way required for one or more embodiments or that one or more embodiments necessarily include logic for deciding, with or without other input or prompting, whether these features, elements, and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

As used in this disclosure, the term "a" or "one" may include one or more items unless specifically stated otherwise. Further, the phrase "based on" is intended to mean "based at least in part on" unless specifically stated otherwise.

What is claimed is:

1. A method comprising:

receiving a plurality of audio data frames;

processing the plurality of audio data frames using at least one first model to determine a plurality of subsampled data frames, wherein a single frame of the subsampled data frames corresponds to at least two frames of the audio data frames;

processing the plurality of subsampled data frames to determine a plurality of upsampled data frames, wherein a single frame of the subsampled data frames corresponds to at least two frames of the upsampled data frames;
processing the plurality of upsampled data frames to determine a plurality of respective scores, wherein each respective score corresponds to a likelihood that a respective upsampled data frame of the plurality of upsampled data frames corresponds to an audio event; and
determining an overall score using the plurality of respective scores, wherein the overall score corresponds to a likelihood that the audio event is represented in at least a portion of the plurality audio data frames.

2. The method of claim 1, the method further comprising:
determining the overall score satisfies a condition; and
causing an action to be performed in response to the overall score satisfying the condition.

3. The method of claim 1, wherein:
the plurality of upsampled data frames includes a first upsampled data frame and a second upsampled data frame;
the plurality of respective scores includes a first score corresponding to the first upsampled data frame and a second score corresponding to the second upsampled data frame; and
the processing the plurality of upsampled data frames to determine the plurality of respective scores comprises:
processing the first upsampled data frame using a second model to determine the first score, and
processing the second upsampled data frame using the second model to determine the second score.

4. The method of claim 3, the method further comprising:
multiplying the first upsampled data frame by the first score to determine a first weighted upsampled data frame; and
multiplying the second upsampled data frame by the second score to determine a second weighted upsampled data frame;
summing at least the first weighted upsampled data frame and the second weighted upsampled data frame to obtain a composite upsampled data frame;
summing at least the first score and second score to determine a cumulative score; and
dividing the composite upsampled data frame by the cumulative score to obtain a weighted composite upsampled data frame,
wherein determining the overall score comprises processing the weighted composite upsampled data frame using the second model to determine the overall score.

5. The method of claim 1, wherein the at least one first model comprises at least one bi-directional recurrent neural network.

6. The method of claim 1, wherein:
the plurality of audio data frames comprises a first audio data frame, a second audio data frame, a third audio data frame, and a fourth audio data frame,
the plurality of upsampled data frames comprises a first upsampled data frame and a second upsampled data frame, and
the method further comprises:
processing the first audio data frame and the second audio data frame using at least a first bi-directional recurrent neural network to determine first subsampled data;
processing the third audio data frame and the fourth audio data frame using at least the first bi-directional recurrent neural network to determine second subsampled data;
processing the first subsampled data and the second subsampled data using at least a second bi-directional recurrent neural network to determine third subsampled data;
determining the first upsampled data frame using the first subsampled data and the third subsampled data; and
determining the second upsampled data frame using the second subsampled data and the third subsampled data.

7. The method of claim 1, further comprising:
determining a first score of the plurality of respective scores satisfies a condition, the first score corresponding to a first upsampled data frame of the plurality of upsampled data frames;
determining a first audio data frame corresponding to a same time period as the first upsampled data frame; and
causing an action to be performed using at least the first audio data frame.

8. The method of claim 7, wherein the condition comprises the first score being a greatest of the plurality of respective scores.

9. The method of claim 1, wherein:
the plurality of audio data frames corresponds to a first time scale;
the plurality of subsampled data frames corresponds to a second time scale, where the second time scale is coarser than the first time scale; and
the plurality of upsampled data frames corresponds to the first time scale.

10. A system comprising:
at least one processor; and
at least one memory including instructions that, when executed by the at least one processor, cause the system to:
receive a plurality of audio data frames;
process the plurality of audio data frames using at least one first model to determine a plurality of subsampled data frames, wherein a single frame of the sub sampled data frames corresponds to at least two frames of the audio data frames;
process the plurality of subsampled data frames to determine a plurality of upsampled data frames, wherein a single frame of the subsampled data frames corresponds to at least two frames of the upsampled data frames;
process the plurality of upsampled data frames to determine a plurality of respective scores, wherein each respective score corresponds to a likelihood that a respective upsampled data frame of the plurality of upsampled data frames corresponds to an audio event; and
determine an overall score using the plurality of respective scores, wherein the overall score corresponds to a likelihood that the audio event is represented in at least a portion of the plurality of audio data frames.

11. The system of claim 10, further comprising instructions that, when executed by the at least one processor, further cause the system to:
determine the overall score satisfies a condition; and
cause an action to be performed in response to the overall score satisfying the condition.

12. The system of claim 10, wherein:
the plurality of upsampled data frames includes a first upsampled data frame and a second upsampled data frame;
the plurality of respective scores includes a first score corresponding to the first upsampled data frame and a second score corresponding to the second upsampled data frame; and
the instructions to process the plurality of upsampled data frames to determine the plurality of respective scores comprise instructions to:
process the first upsampled data frame using a second model to determine the first score; and
process the second upsampled data frame using the second model to determine the second score.

13. The system of claim 12, further comprising instructions that, when executed by the at least one processor, further cause the system to:
multiply the first upsampled data frame by the first score to determine a first weighted upsampled data frame; and
multiply the second upsampled data frame by the second score to determine a second weighted upsampled data frame;
sum at least the first weighted upsampled data frame and the second weighted upsampled data frame to obtain a composite upsampled data frame;
sum at least the first score and second score to determine a cumulative score; and
divide the composite upsampled data frame by the cumulative score to obtain a weighted composite upsampled data frame,
wherein the instructions to determine the overall score comprises processing the weighted composite upsampled data frame using the second model to determine the overall score.

14. The system of claim 10, wherein the at least one first model comprises at least one bi-directional recurrent neural network.

15. The system of claim 10, wherein:
the plurality of audio data frames comprises a first audio data frame, a second audio data frame, a third audio data frame, and a fourth audio data frame,
the plurality of upsampled data frames comprises a first upsampled data frame and a second upsampled data frame, and
the instructions further comprise instructions that, when executed by the at least one processor, further cause the system to:
process the first audio data frame and the second audio data frame using at least a first bi-directional recurrent neural network to determine first subsampled data;
process the third audio data frame and the fourth audio data frame using at least the first bi-directional recurrent neural network to determine second subsampled data;
process the first subsampled data and the second subsampled data using at least a second bi-directional recurrent neural network to determine third subsampled data;
determine the first upsampled data frame using the first subsampled data and the third subsampled data; and
determine the second upsampled data frame using the second subsampled data and the third subsampled data.

16. The system of claim 10, further comprising instructions that, when executed by the at least one processor, further cause the system to:
determine a first score of the plurality of respective scores satisfies a condition, the first score corresponding to a first upsampled data frame of the plurality of upsampled data frames;
determine a first audio data frame corresponding to a same time period as the first upsampled data frame; and
cause an action to be performed using at least the first audio data frame.

17. The system of claim 10, wherein:
the plurality of audio data frames corresponds to a first time scale;
the plurality of subsampled data frames corresponds to a second time scale, where the second time scale is coarser than the first time scale; and
the plurality of upsampled data frames corresponds to the first time scale.

* * * * *